United States Patent [19]
Subotic et al.

[11] Patent Number: 5,111,436
[45] Date of Patent: May 5, 1992

[54] 2D CHARGE COUPLED DEVICE MEMORY WITH ACOUSTIC CHARGE TRANSPORT MULTIPLEXER

[76] Inventors: Nikola S. Subotic, 1760 Traver Rd., Ann Arbor, Mich. 48105; Michael T. Eismann, 890 Lambkins, Saline, Mich. 48176

[21] Appl. No.: 598,967
[22] Filed: Oct. 17, 1990
[51] Int. Cl.$^5$ .............................................. G11C 13/00
[52] U.S. Cl. .................... 365/238; 365/183
[58] Field of Search ............... 365/238, 63, 183, 219, 365/220, 221, 189.12

[56] References Cited
U.S. PATENT DOCUMENTS
4,811,305  3/1989  Watanabe et al. ................. 365/238

Primary Examiner—Terrell W. Fears
Attorney, Agent, or Firm—Krass & Young

[57] ABSTRACT

Two dimensional charge coupled device (CCD) memories are coupled to acoustic charge transport devices (ACT) which act as input and/or output multiplexers for the memories. In a preferred embodiment of the invention, the input to a NXM memory is in the form of an optical image projected on the CCD device and the output stage of each column of the memory is provided to one of N FET switches. A 1-D ACT device has multiple taps each connected to the gate of one of the FET switches and as an impulse signal propagates along the ACT channel, the FET switches are successively triggered causing the column outputs to be provided to a summing device to generate a serial output.

In an alternative embodiment forming a corner-turn memory, an ACT tapped delay line has a number of equally spaced electrode taps equal to the number of columns of a CCD corner-turn array and each tap is connected to an electrical switch which in turn is connected to an input cell of a bordering row of the array. A serial data stream which may be either analog or digital is provided to the electrical switches which are timely activated by the ACT device and is fed in parallel to the array and then shifted between columns, in parallel, to fill the array. An output ACT multiplexer employing FET switches is provided orthogonally to the input multiplexer and receives the output of each column of the array and generates a serial output stream.

14 Claims, 2 Drawing Sheets

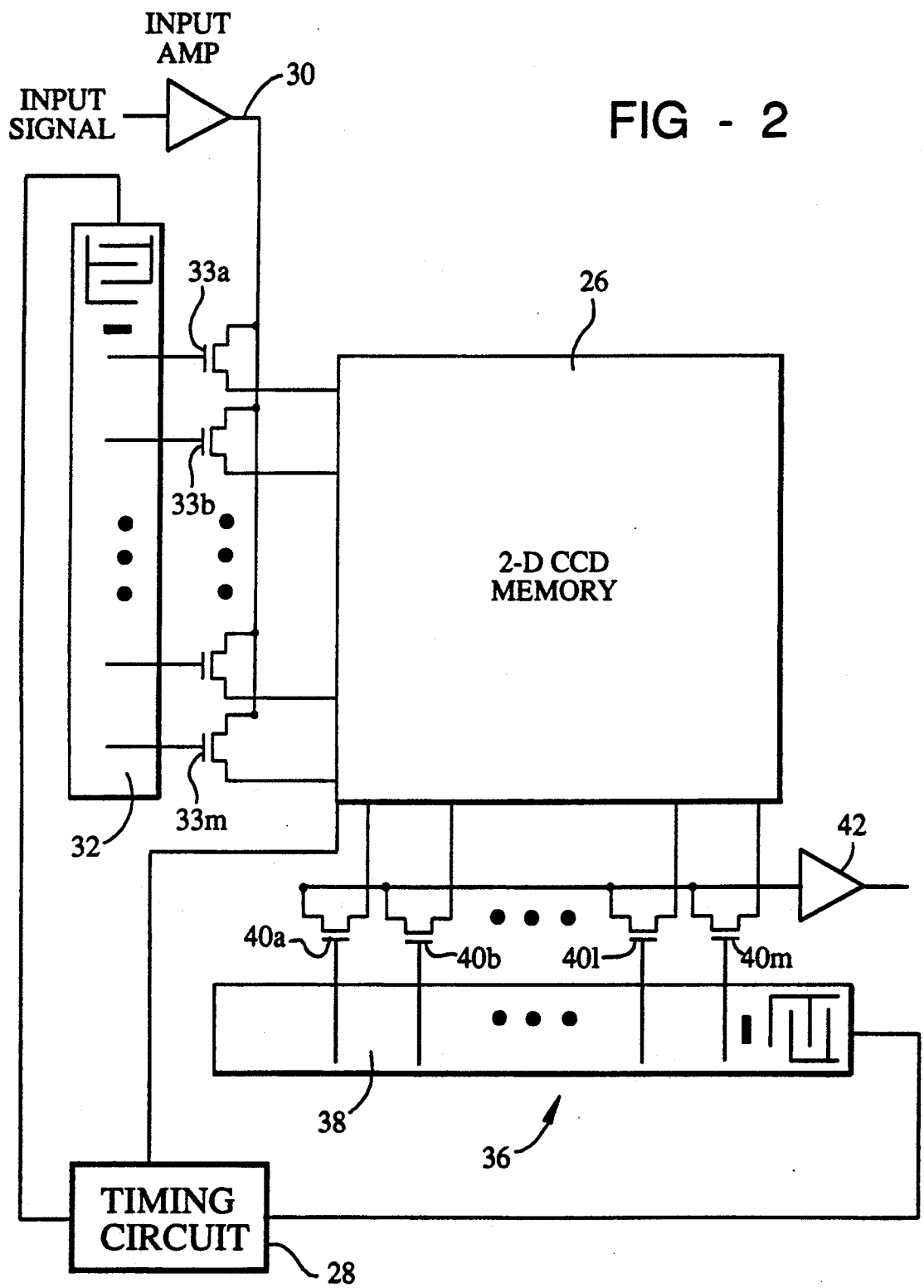

2D CHARGE COUPLED DEVICE MEMORY WITH ACOUSTIC CHARGE TRANSPORT MULTIPLEXER

FIELD OF THE INVENTION

This invention relates to charge coupled device two-dimensional memories employing acoustic charge transport devices as input and/or output multiplexers and to cornerturn configurations of such memories.

BACKGROUND OF THE INVENTION

Two-dimensional charge coupled device (CCD) arrays are widely used as optical image sensors, memories and processing devices in image and data processing systems. Charge transport is the mechanism employed to output stored data in all forms of CCD arrays and also to input data in corner-turn CCD memories, which have the capability of shifting charges on a parallel basis between columns to input data in the form of electrical signals, introduced into a bordering column, through the balance of the memory, as well as shifting data down rows to provide output. The bandwidth of a CCD array is limited by the time required to transfer charges into and out of each cell of the array. CCD devices are generally capable of transferring charges at a maximum rate of about 10 MHz. However, the limit on the charge transfer rate between elements within the array is not the most critical limiting factor in the bandwidth of a CCD array.

CCD arrays usually employ shift register type multiplexers for input or output purposes. As input devices, principally on corner-turn CCD arrays, the multiplexers accept a serial input data signal and when full feed it in parallel into connectors for the cells in a bordering column of the array. As output devices on all forms of CCD arrays, the multiplexers receive the parallel output from either bordering cells of the array, or in an interline transfer type array, from the outputs of vertical readout registers which are interlaced with each column of the photosensitive sites and serially read the signal out. In this interline transfer scheme after the photosensitive area has collected photoelectrons during an integration period, the charges in each column of cells are transferred in parallel to bordering column shift registers. The column shift registers are clocked out into the output multiplexer while the photosensitive area collects a new set of photoelectrons.

In this combined array/multiplexer architecture, the overall data rate of the device is usually limited by the rate at which the output multiplexer can clear the data rather than the intercell charge transfer rate. In prior art devices, multiplexers have been integrated with the arrays and accordingly subjected to the same basic intercell charge transfer rate limitation as the array. Thus, where an N row CCD array receives its input in parallel from a CCD shift register multiplexer or where an N column CCD array provides output through an integrated CCD shift register, the intercell clock rate is equal to the maximum charge transfer rate divided by N. Since typical intercell charge transfer rates of CCD devices are on the order of 10 MHz, the allowable clock speed in a 2-D CCD array serviced by a CCD multiplexer then becomes 10/N MHz, where N is the number of rows or columns connected to the multiplexer.

One solution to the problem is to divide up the input or output multiplexers into a number of shorter sections, each servicing a fraction of the rows or columns of the array and providing additional multiplexer devices, either integrated with the CCD structure or formed discretely, to feed an input serial data stream into the plurality of input multiplexers or to receive the outputs of the plurality of output multiplexers and convert those outputs into a serial data stream.

As fabrication techniques have been developed permitting larger CCD arrays, this speed limitation imposed by the maximum charge transfer rates within integrated input or output multiplexers has resulted in a difficult tradeoff between speed and complexity of input and/or output.

Another, independent factor in signal processing technology has been the development of acoustic charge transport (ACT) devices. Unlike the CCD devices, which are silicon based and employ sequential potential well differences to provided by applied voltages in electrodes to transfer charge, the ACT devices employ a surface acoustic wave (SAW) that is generated directly in the piezo-electric gallium arsenide substrate of an ACT. ACT devices are constructed as elongated channels and as the SAW propagates along the channel, it carries charges representing multiplexed samples of an input analog signal. As these charges pass taps spaced along the length of the ACT channel, they induce electric fields in the taps proportional to the instantaneous charge at that position. The taps may be digitally selected and the ACT devices are thus capable of acting as serial to parallel multiplexers. The ACT devices have bandwidth capabilities of up to 600 MHz.

SUMMARY OF THE PRESENT INVENTION

The present invention is directed toward hybrid signal processing devices employing CCD arrays which operate at substantially higher speeds than prior art arrays by employing ACT devices as input and/output multiplexers for the CCD arrays so that the substantially higher transfer rates of the ACT devices remove bandwidth limitations created by prior art arrays with integrated CCD multiplexers. These novel structures may receive input data either optically or electrically. The electrical input version employing an ACT input multiplexer FET array and an orthogonally arrayed ACT output multiplexer creates an extremely high speed corner-turn memory for use in signal processing applications such as large time-bandwidth product linear processors using short time Fourier transforms. In such a processor a succession of Fourier transforms are made upon windowed (short time-bandwidth product) data. An intermediate 2-D corner-turn memory is used to store the succession of Fourier transforms. Next, an orthogonal readout of this memory is performed with the data being Fourier transformed. Lastly, the overlap-add method of recombining the short time-bandwidth product Fourier transforms is used to produce the large time-bandwidth Fourier transform which is the desired output.

As will be subsequently described in detail, in a preferred embodiment of the invention taking the form of a CCD array with an ACT output multiplexer, if the memory has N channels, a series of N MOSFET switches are provided. Each MOSFET switch has its source connected to the output end of one column of the array and each has its drain connected to a common summing device. The gates of the FETS are each electrically connected to one of N equally spaced taps on the ACT device. The timing circuitry of the array is synchronized with the timing circuitry of the ACT device, and when charges are transferred out of the ends of each column of the array to the source terminals of the FETS, an impulse input is provided to the ACT device. As the impulse propagates down the ACT channel it sequentially triggers each of the FETS so that they sequentially provide output signal from the CCD array to the summing device and therefore convert the parallel output of the array into a serial output signal. Since this transfer occurs at about 60 times the speed of charge transfer within the CCD array, up to about 60 columns can be serviced in this manner without limiting the CCD array clocking speed below the limit imposed by the intercell charge transfer rate. If more than 60 columns are required a plurality of ACT multiplexers can be provided each servicing up to 60 columns and their outputs can be combined with an external device.

Output multiplexers of this form can be employed with optically injected CCD arrays, for cameras or the like, as well as electronically loaded CCD arrays. In an alternative embodiment of the invention, input to the CCD array is provided by an ACT multiplexer that has its output taps connected to gates of an input set of MOSFET switches. Each MOSFET switch has its drain connected to the cells of a bordering column of the CCD array. The serial input signal to the MOSFETS may either be analog or digital. The switching pulse propagates down the ACT channel and triggers the MOSFETS to transfer the signal to the CCD array. The output multiplexer may either be from the cells of the far column of the array, creating a pass-through configuration, or from the orthogonal end row of the memory, to create a corner-turn memory.

BRIEF DESCRIPTION OF THE DRAWINGS

Other objectives, advantages and applications of the present invention will be made apparent by the following detailed description. The description makes reference to the accompanying drawings in which:

FIG. 2 is a schematic diagram of a 2-D CCD array corner turn memory operative to receive input from a first ACT multiplexer and to provide output through a second ACT multiplexer.

DETAILED DESCRIPTION OF THE PREFERRED EMBODIMENT

Figure 1:
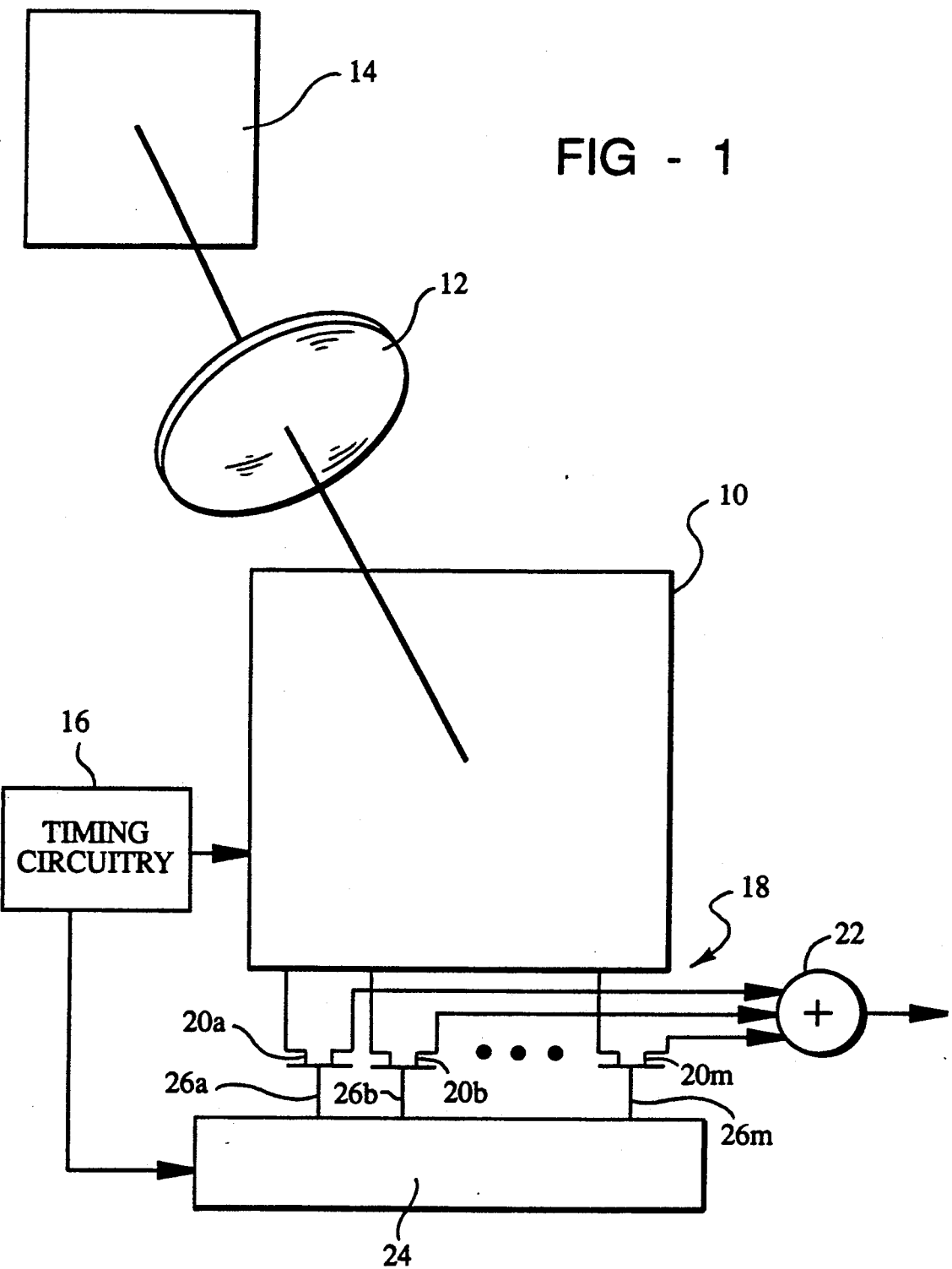
FIG. 1 is a partially schematic, partially block diagram of a preferred embodiment of the invention comprising an optical read-in, 2-D CCD array having an ACT based output multiplexer.

Referring to FIG. 1, the preferred embodiment of the present invention comprises a 2-D CCD memory array having optical input and an ACT based output multiplexer. A 2-D CCD memory array 10 may be loaded with a 2-D array of data optically through a lens system 12. A scene 14 is imaged by the lens system 12 onto the array 10 so that each pixel in the 2-D array 10 receives a charge proportional to the optical energy radiated or reflected from the point in the scene 14 which is imaged on that pixel of the array. By way of example the array 10 may be acting as the photosensitive element in a television system.

Timing circuitry 16 has an output to the array 10 and provides signals to the array which cause an intercell charge transfer down each column of the array in the direction of an output multiplexer generally indicated at 18. These charge transfer pulses may occur at any rate up to the maximum intercell charge transfer rate of the array, typically 10 MHz.

Each cell in the output row of the 2-D array 10, illustrated as the bottom row in FIG. 1, connects to the source terminal of one of a number of FET switches equal in number to the columns of the array, denominated 20a, 20b . . . 20n. The output terminals of each of the FETs 20a, 20b . . . 20n, are connected to a common summing circuit 22. The output of the summing circuit 22 represents the data output of the device and constitutes a serial signal representing a raster scan of the signals stored in the 2-D array 10.

The FET switches 20a, 20b . . . 20n, are triggered by signals propagated along the channel of an ACT device 24. The ACT device 24 receives an output from the timing circuit 16 in timed relation to the intercell transfers of the charges within the array 10, along the columns of the array. Each time charges are transferred down the columns of the array 10, a signal is provided to the ACT device, which is carried along its channel by an acoustic propagating wave generated in the piezo-electric gallium arsenide substrate of the ACT. The ACT has n taps disposed along its length, 26a, 26b . . . 26n. As the switching pulse signal provided by the timing circuit 16 propagates down the ACT channel, charges are sequentially induced at each tap and cause triggering of the FET switch associated with such tap. In this manner the charges contained in each cell of the bottom row of the array 10 are sequentially provided to the output device 22.

As long as the array 10 has less than about 60 columns, the ACT multiplexer 18 can output the charges in the array without compromising the maximum intercharge transfer rate of the array. If a larger number of columns are required a plurality of ACT multiplexers may be employed. The taps of the multiple ACT devices may be connected to alternate FET switches receiving the output of the bottom row of the array 10 and the acoustic propagating waves generated in the multiple ACT multiplexers may be staggered relative to one another so that first an FET switch controlled by the first ACT device is triggered and then a FET switch controlled by the second ACT device is triggered. The output terminals of all of the switches are provided to a common summing device to create a serial output signal at a multiple of the triggering rate of the ACT devices.

A second embodiment of the invention representing an electric input CCD corner turn memory employing ACT devices for both input and output multiplexers, is illustrated in FIG. 2. The CCD array 26 is adapted to transfer charges between columns and along rows under control of signals from a timing circuitry generator 28.

An input signal for the corner turn memory is provided in serial form on line 30. It may consist of either a digital or an analog signal. The input signal passes down line 30 and to a series of FET switches designated 33a, 33b, . . . 33n. Each FET switch has its drain connected to the input element of a different row of the CCD array 26.

The FET switches 33a, 33b . . . 33n are triggered by an impulse signal propagated along the ACT multiplexer 32 by a SAW. The impulse signal is provided by timing circuitry generator 28. The FET's are serially switched due to the interval of time it takes for the SAW to reach each of the spaced output taps of the ACT. The FET's, as they are switched, sample the input signal on line 30 and transfer the sampled signal to the input column of the CCD array 26. The FET's are selected to match the impedance in line 30 to the impedance of the CCD array 26 to optimize time transfer. Subsequent pulses from the timing circuit 28 cause the charges in the input column to be transferred to the next column and a subsequent set of signals from input line 30 to be transferred to the bordering column. Through a repetition of this process the entire array 26 is filled with signals.

The output multiplexer for the system of FIG. 2, generally indicated at 36, is similar to the output multiplexer employed with FIG. 1 and includes an ACT device 38 having taps connected to the trigger inputs of a plurality of FET switches 40a, 40b... 40n. The source terminal of each of these FET switches is connected to an element of the bottom row of the CCD array 26 and the drain terminals of each of the FET switches are connected to an output amplifier 42.

After the array 26 has been filled by signals originating from the ACT input multiplexer 32 the charges are transferred downwardly along each column by signals from timing circuit 28 and as each new row is introduced to the bottom of the array, it is outputted in a serial fashion by the output multiplexer 36.

What is claimed is:

1. A signal processor, comprising:
   a two-dimensional charge coupled device (CCD) array having connectors for each cell of at least one bordering row;
   drive circuitry connected to the CCD array operative to transfer charges along common rows;
   an acoustic charge transport (ACT) device having equally spaced taps equal in number to the columns of the CCD array;
   means coupling a plurality of taps of the ACT device to a respective plurality of said connectors of the CCD array; and
   timing circuitry connected to the drive circuitry and to the ACT device operative to cause the transfer of charges into or out of said bordering row of cells of the CCD array in timed relation to the propagation of a timing signal along the ACT device.

2. The signal process of claim 1 wherein the ACT device forms a part of an input multiplexer for the CCD array; said multiplexer including:
   electrical switch connections between said plurality of taps of the ACT device and said plurality of connectors for said bordering row of the CCD array;
   means for providing a timing signal to the input of the ACT device to close said electrical switch connections; and
   means for providing a plurality of timed multiplexed elements of an input signal, in parallel, to the cells of said border row of the CCD array through said closed electrical switch connections.

3. The signal processor as defined in claim 2 wherein said electrical switch connections comprise field effect transistors (FETS); each FET has a trigger element connected to the ACT, a connection to the CCD array and a connection to an input signal line.

4. The signal processor of claim 2 in which said input signal comprises an analog signal.

5. The signal processor of claim 2 in which said input signal comprises a digital, binary signal.

6. The signal processor of claim 1 wherein said ACT device acts as part of an output multiplexer for the CCD array and further including:
   a summing unit;
   a plurality of electronic switches, each having one connection to one of the cells in said border row of the CCD array and another connection to said summing unit;
   connections between each tap of the ACT device and the triggering input of one of said switches; and
   means for feeding an impulse signal into said ACT device in timed relation to the transfer of charges between adjacent rows of the CCD array, said ACT device being operative to sequentially trigger each of the switches to generate a serial signal at the output of the summing unit representing the contents of successive cells of said border row of the CCD array.

7. The signal processor of claim 6 wherein said switches each consist of a field effect transistor having its source connected to an associated cell in said border row of said CCD array, having its drain connected to said summing unit and having its trigger connected to an associated tap of the ACT device.

8. The signal processor of claim 1 wherein said ACT device has a plurality of spaced taps equal in member to the cells of said border row of said CCD array and acts as an input multiplexer for said CCD array and further including a second ACT device having a plurality of spaced taps equal in number to the cells along a second border row of said CCD array and acts as an output multiplexer for said CCD array; a plurality of electronic switches equal in number to said taps of said first and second ACT's, each switch having its trigger element connected to one of said taps of said first and second ACT devices, having one pole connected to one of the cells of said respective first or second border of said CCD array and having its other pole connected to a respective input or output line, and means for inputting an impulse signal into said first and second ACT devices in timed relation to the provision of electrical signals fed to the switches from the input line or from the cells of said second border of the CCD array and the transfer of charges between adjacent rows of the CCD array.

9. The signal processor of claim 8 wherein said second border of the CCD array extends parallel to said first border and the signal processor acts as a pass through memory.

10. The signal processor of claim 8 wherein said second border of the ACT device extends normally to said first border and the signal processor acts a corner-turn memory.

11. The signal processor of claim 1 including means for projecting an optical image on said CCD array so as to unload its cells with charges.

12. The signal processor as defined in claim 1 wherein said ACT device forms a part of an output multiplexer for the CCD array; said multiplexer including:
   electrical switch connections between said plurality of taps of the ACT device and said plurality of connectors for said bordering row of the CCD array;
   means for providing a timing signal to the input of the ACT device to close said electrical switch connections;
   means for providing a plurality of input signals from the cells of said bordering row of the CCD array through said closed electrical switch connections in serial fashion.

13. A corner-turn memory, comprising:

a two dimensional CCD array having N rows and M columns of elements;

driver means for said array operative, in a first mode, to transfer charges between adjacent columns of the array and, in a second mode, to transfer charges between adjacent rows of the array;

an ACT input multiplexer having M equally spaced taps, each tap being connected to a cell in a border column of the ACT device;

a second ACT device having N equally spaced taps, each associated with one cell in a border row of said ACT device;

N electronic switches, each associated with one cell of said border row of said CCD array;

N electronic switches, each being associated with one cell of said border row of the CCD array and one tap of said second ACT device, the taps of said second ACT device being connected to the trigger elements of the associated switch and the cells of said row of said CCD array being connected to the one pole of each of said switches;

a summing unit having inputs from all of the second poles of said switching devices;

means for providing an input serial signal to said first ACT device;

means for generating an impulse signal at the input of said second ACT device in time relation to the transfer of charges, by said driver, from row to row of said CCD array.

14. The signal processor of claim 1 wherein said ACT device acts a parallel to serial output multiplexer for signals in said border row of the CCD array, further including:

a plurality of field effect transistors (FET) equal in number to and one associated with each tap of said ACT device, taps being connected to the gates of the ACT device, the source of each FET being connected to one cell of said border row of the CCD array and the drains of each FET being connected to a common summer, and means for inputting an impulse signal into said ACT device to cause sequential triggering of each of the FETs and sequential output of the contents of the cells of said border row of said CCD array through the summer.

* * * * *